United States Patent
Ang

(10) Patent No.: US 7,919,334 B2
(45) Date of Patent: Apr. 5, 2011

(54) MRAM

(75) Inventor: Kor Seng Ang, Singapore (SG)

(73) Assignee: Showa Denko HD Singapore Pte Ltd., Singapore (SG)

( * ) Notice: Subject to any disclaimer, the term of this patent is extended or adjusted under 35 U.S.C. 154(b) by 96 days.

(21) Appl. No.: 12/493,612

(22) Filed: Jun. 29, 2009

(65) Prior Publication Data

US 2010/0003834 A1      Jan. 7, 2010

(30) Foreign Application Priority Data

Jul. 1, 2008   (SG) .............................. 200805077-5

(51) Int. Cl.
   *H01L 21/02*      (2006.01)
(52) U.S. Cl. .......................................... 438/3; 438/770
(58) Field of Classification Search ............... 438/3, 770
   See application file for complete search history.

(56) References Cited

U.S. PATENT DOCUMENTS

| | | | |
|---|---|---|---|
| 6,347,049 B1* | 2/2002 | Childress et al. ............. | 365/173 |
| 7,141,438 B2* | 11/2006 | Ha et al. ............................. | 438/3 |
| 7,238,979 B2* | 7/2007 | Horng et al. .................. | 257/295 |
| 7,264,974 B2* | 9/2007 | Horng et al. ...................... | 438/3 |
| 2005/0062076 A1* | 3/2005 | Motoyoshi .................... | 257/222 |
| 2006/0161079 A1* | 7/2006 | Choi et al. .................... | 600/595 |
| 2007/0155027 A1* | 7/2007 | Ditizio .............................. | 438/3 |
| 2008/0138660 A1* | 6/2008 | Parkin .......................... | 428/812 |
| 2008/0191254 A1* | 8/2008 | Matsuura ...................... | 257/295 |
| 2008/0200003 A1* | 8/2008 | Hong et al. ................... | 438/384 |

* cited by examiner

*Primary Examiner* — Savitri Mulpuri

(74) *Attorney, Agent, or Firm* — Sughrue Mion, PLLC

(57) ABSTRACT

Disclosed is a method to convert a low resistance cell in a MRAM device to a capacitive cell. The low resistance cell has a plurality of layers on a substrate. At least one layer remote from the substrate is sensitive to oxygen infusion. The method includes removing a cap layer of the cell and applying an oxygen barrier around the cell to expose at least a part of a surface of the at least one layer remote from the substrate. The at least one layer is oxidized. The oxygen barrier is removed.

20 Claims, 3 Drawing Sheets

MRAM

TECHNICAL FIELD

This invention relates to improvements in and relating to magnetoresistive random access memory ("MRAM") and relates particularly, though not exclusively, to a method to convert a low resistance cell in a MRAM device to a capacitive cell.

BACKGROUND

Many applications in MRAM are connected in parallel configuration. A single low resistance path results in a higher drain current through the low resistance path. A low resistance path can be created during a thin film process due to surface asperity or contamination. This may not be a desirable outcome for efficient operation of the MRAM device because a shorted cell causes a high surge in the current. This could result in the current exceeding the current source capability. A cross bar connection in parallel may easily be made but is sensitive to such a low resistance path. By removing any such low resistance path at a wafer probe level, assistance is given to reducing and, hopefully, eliminating such risk. When one cell in a row is shorted, the whole row cannot be used.

SUMMARY

In accordance with an exemplary aspect there is provided a method to convert a low resistance cell in a MRAM device to a capacitive cell. The low resistance cell has a plurality of layers on a substrate. At least one layer remote from the substrate is sensitive to oxygen infusion. The method includes removing a cap layer of the cell and applying an oxygen barrier around the cell to expose at least a part of a surface of the at least one layer remote from the substrate. The at least one layer is oxidized. The oxygen barrier is removed. A second cap layer may be applied. The oxidizing of the at least one layer may convert the at least one layer to a ceramic state.

According to another exemplary aspect, there is provided a method to convert a low resistance cell in a MRAM device to a capacitive cell. The low resistance cell has a plurality of layers on a substrate. At least one layer remote from the substrate is sensitive to oxygen infusion. The method includes removing a cap layer of the cell and applying an oxygen barrier around the cell to expose at least a part of a surface of the at least one layer remote from the substrate. The at least on layer is at least partially converted to a ceramic state. The oxygen barrier is removed. A second cap layer may be applied. The conversion may be by oxidizing the at least one layer.

According to a further exemplary aspect there is provided a method to isolate a low resistance cell in a MRAM device to a capacitive cell, the low resistance cell comprising a plurality of layers on a substrate, at least one layer remote from the substrate being sensitive to oxygen infusion, the method comprising:
  removing a cap layer of the cell;
  applying an oxygen barrier around the cell to expose at least a part of a surface of the at least one layer remote from the substrate; and isolating the low resistance cell by performing at least one selected from the group consisting of:
    at least partially converting the at least one layer to a ceramic state, and
    at least partially oxidizing the at least one layer.

For all aspects the conversion may be partial, substantial, or substantially total. Conversion may make the at least one layer behave like a capacitor The at least one layer may comprise two uppermost and adjacent layers. The removal of the cap layer may expose an upper surface of an uppermost layer of the two uppermost and adjacent layers. The uppermost layer may be the layer most remote from the substrate. The oxygen barrier may be applied around but not over the upper surface, or may partially overlap the upper surface. The removal of the cap layer may be by chemical etching, use of lasers, or use of suitable optical devices. The oxygen barrier may be an oxygen retardant coating. The oxidation may be a high oxidation process. The high oxidation process may be gas oxidation or chemical liquid oxidation. Thermal assistance may be applied during oxidation.

An intermediate layer between the substrate and the at least one layer may be a semi-conductor or insulator. Oxidation may not proceed past the intermediate layer. Prior to the cap layer being removed, the low resistance cell may be detected and identified.

BRIEF DESCRIPTION OF THE DRAWINGS

In order that the invention may be fully understood and readily put into practical effect there shall now be described by way of non-limitative example only exemplary embodiments, the description being with reference to the accompanying illustrative drawings.

In the drawings.

DETAILED DESCRIPTION OF EXEMPLARY EMBODIMENTS

Figure 1:
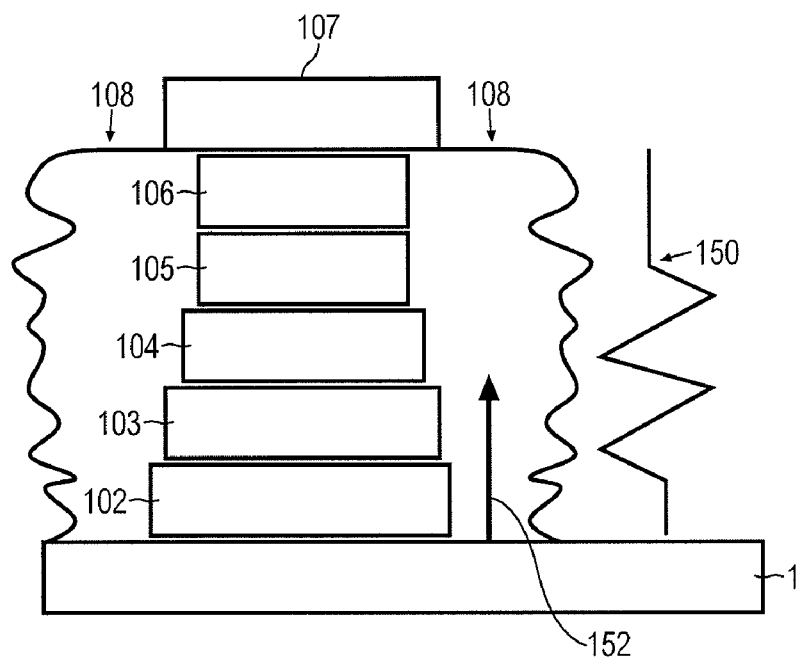
FIG. 1 is a vertical cross-sectional view showing a known typical multi-layer thin film MRAM device and the equivalent resistance to "ground"

In the drawings like components have like reference numerals with a prefix number indicating the relevant drawing figure.

Figure 2:
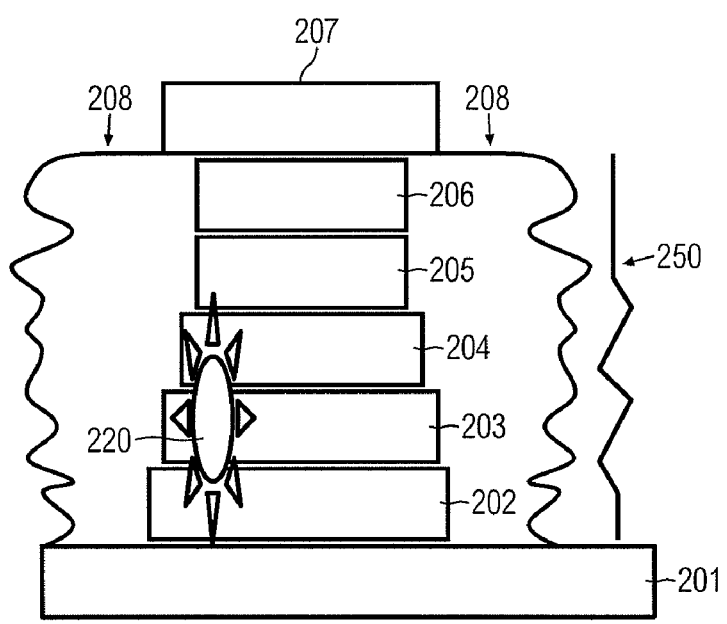
FIG. 2 is a view corresponding to FIG. 1 showing a shorted cell due to contamination or abnormal growth.

FIG. 1 shows a known typical multi-layer thin film MRAM device 100 having a substrate 101; multiple layers 102, 103, 104, 105 and 106, as well as a cap layer 107 (as an electrical connection layer). A grain-to-grain insulator 108 is provided. The two uppermost and adjacent layers 105 and 106 are relatively sensitive to oxygen infusion. They may be, for example, a compound of Co, Fe, and/or CoFe. The layer 104 may be of a material that is a semi-conductor or insulator such as, for example, MgO and/or $Al_2O_3$. The equivalent resistance to "ground" 150 is shown as a relatively high resistance. In such a case the current 152 is greater than zero amperes. In FIG. 2 there is shown a shorted cell 220 such that the equivalent resistance to ground 250 is relatively low. The shorted cell 220 may be due to a contaminant and/or abnormal growth.

Figure 3:
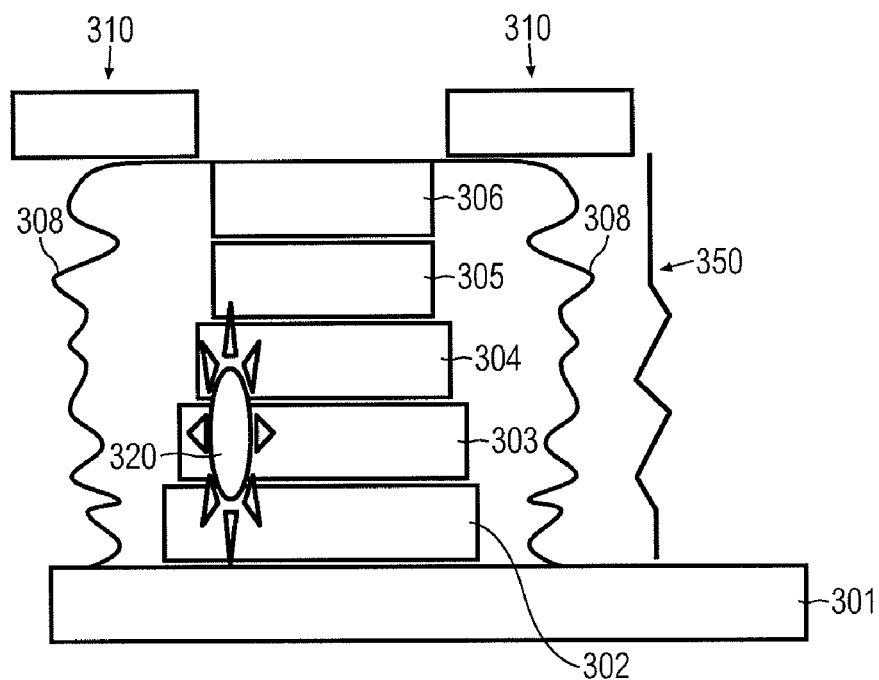
FIG. 3 is a view corresponding to FIGS. 1 and 2 showing a first stage of an exemplary embodiment where a coating is applied and the low resistance cell is exposed for oxidation.
Figure 4:
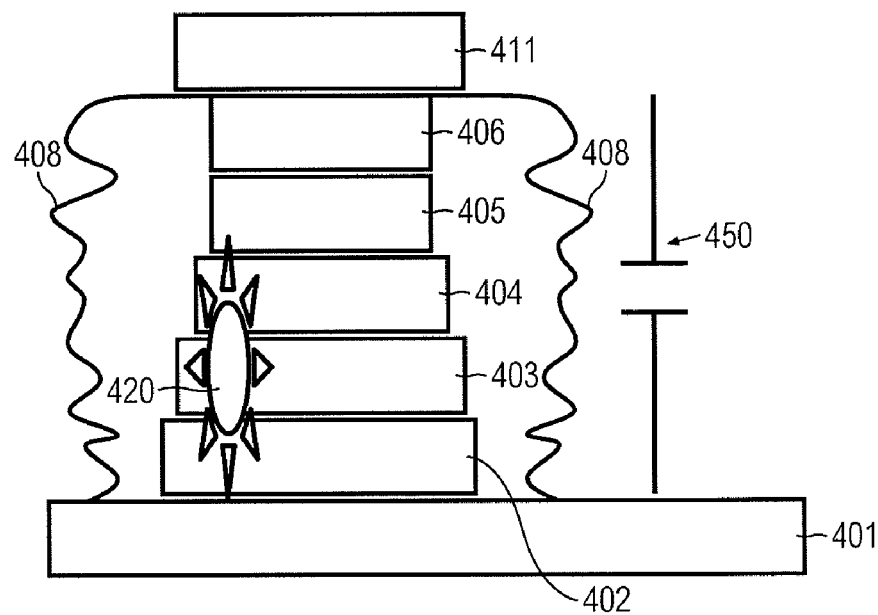
FIG. 4 is a view corresponding to FIG. 3 at a second stage where the oxygen barrier coating is removed and a second cap layer installed.
Figure 5:
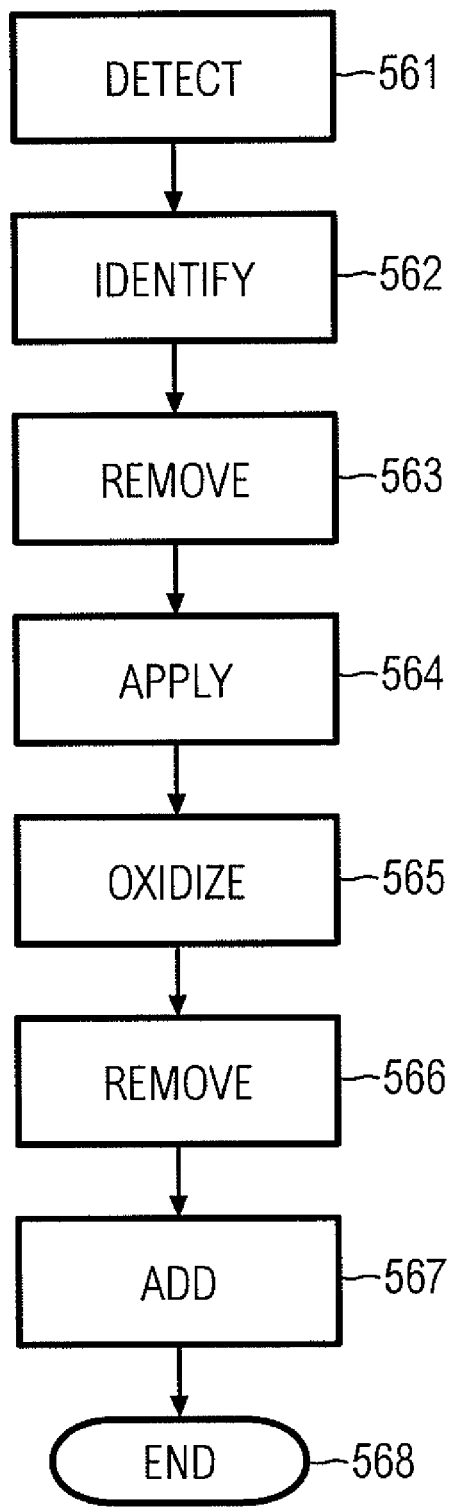
FIG. 5 is a flow chart of the exemplary embodiment of FIGS. 3 and 4.

The exemplary process is illustrated in FIGS. 3 to 5. When a shorted cell is detected (561) by use of, for example, a wafer probe with digital pulse sensing, the identity of the low resistance cell or shorted cell 332 is determined (562) with the methodology used depending on the stack resistance distribution.

The cap layer 207 is then removed (563) for the cell to expose the upper surface of the uppermost layer 306, being the layer most remote from the substrate 301, and an oxygen barrier or oxygen retardant coating 310 applied (564) around but not completely over the upper surface of the uppermost layer 306. The coating 310 may overlap with the uppermost layer 306 but must not completely cover the uppermost layer 306. It is preferred that the oxygen barrier substantially, if not completely, avoids overlap with the uppermost layer 306. If required or desired, the order of process actions (563) and (564) may be reversed such that the oxygen barrier 310 is applied before the cap layer 207 is removed. The removal of the cap layer 207 may be by, for example, etching. Etching may be chemical etching or by use of lasers or other suitable optical devices.

At least the cell, and preferably the wafer, is subjected to an oxidation process, preferably a high oxidation process (565). The oxidation process can be either gas oxidation using, for example, steam; or a chemical liquid oxidation using, for example, hydrogen peroxide ($H_2O_2$). As the material of layers 305 and 306 are sensitive to oxygen infusion, they are at least in part, but preferably substantially, and more preferable substantially totally, converted into a ceramic state due to the oxidation:

The extent of conversion may be different in the two layers 305, 306. For example, layer 306 may have a higher level of conversion than layer 305 as layer 305 can only be converted by oxygen that passes through layer 306. Preferably, both layers 305, 306 may be at least partially converted. But at least one layer 306 should be at least partially converted. Thermal assistance may be applied during oxidation to enhance the level of oxidation and/or to accelerate the rate of oxidation. For example, if using steam for oxidation the steam may be above 100° C. but would not be in the temperature ranges for superheated steam. The steam should have sufficient pressure to have enough momentum to achieve the oxidation of layers 305, 306. As the material of layer 304 is a semi-conductor or insulator, oxidation dies not proceed past layer 304 and therefore layers 302 and 303 are not oxidized.

After the oxidation, the oxygen barrier 310 is removed (566) using a typical photoresist removal process. A second cap layer 411 may be added (567). The process ends (568).

As the oxidation of layers 405, 406 converts the material in the layers 405, 406 into a ceramic state, the layers 405, 406 will each behave like a capacitor 450. As the two layers 405, 406 are between the cap layer 411 and the substrate 401 this avoids a direct low resistance path to ground. As such the oxidation/conversion of the layers 405, 406 effectively isolates the shorted cell 420. By isolation it is meant substantial electrical isolation.

The exemplary embodiment described may enable cross bar connections, and a parallel connection design, to avoid a shorted cell. It may further enable row level switching to reduce operating frequency. Further, it may enhance wafer yield and reduce part costs. Additionally, it may enable cross bar MRAM; and for a multi-cell thin film battery to be connected.

Whilst the foregoing description has described exemplary embodiments, it will be understood by those skilled in the technology concerned that many variations in details of design, construction and/or operation may be made without departing from the present invention.

The invention claimed is:

1. A method to convert a low resistance cell in a MRAM device to a capacitive cell, the low resistance cell comprising a plurality of layers on a substrate, at least one layer remote from the substrate being sensitive to oxygen infusion, the method comprising:
   removing a cap layer of the cell;
   applying an oxygen barrier around the cell to expose at least a part of a surface of the at least one layer remote from the substrate;
   oxidizing the at least one layer, thereby converting a low resistance cell in a MRAM device to a capacitive cell; and
   removing the oxygen barrier.

2. A method as claimed in claim 1, wherein the oxidizing of the at least one layer converts the at least one layer to a ceramic state; the conversion being selected from the group consisting of: partially, substantially, and substantially totally; the conversion making the at least one layer behave like a capacitor.

3. A method as claimed in claim 1, wherein the at least one layer comprises two uppermost and adjacent layers; the removal of the cap layer exposing an upper surface of an uppermost layer of the two uppermost and adjacent layers, the uppermost layer being the layer most remote from the substrate.

4. A method as claimed in claim 3, wherein the oxygen barrier is applied in a manner selected from the group consisting of: around but not over the upper surface, and partially overlapping the upper surface.

5. A method as claimed in claim 1, wherein removal of the cap layer is by at least one selected from the group consisting of: etching, chemical etching, use of lasers, and use of suitable optical devices.

6. A method as claimed in claim 1, wherein the oxygen barrier is an oxygen retardant coating and the oxidation is a high oxidation process selected from the group consisting of: gas oxidation, and chemical liquid oxidation.

7. A method as claimed in claim 1, wherein prior to the cap layer being removed, the low resistance cell is detected and identified.

8. A method to convert a low resistance cell in a MRAM device to a capacitive cell, the low resistance cell comprising a plurality of layers on a substrate, at least one layer remote from the substrate being sensitive to oxygen infusion, the method comprising:
   removing a cap layer of the cell;
   applying an oxygen barrier around the cell to expose at least a part of a surface of the at least one layer remote from the substrate;
   at least partially converting the at least one layer to a ceramic state, thereby converting a low resistance cell in a MRAM device to a capacitive cell; and
   removing the oxygen barrier.

9. A method as claimed in claim 8, wherein the conversion is by oxidizing the at least one layer; the conversion being selected from the group consisting of: partially, substantially, and substantially totally; and the conversion makes the at least one layer behave like a capacitor.

10. A method as claimed in claim 8, wherein the at least one layer comprises two uppermost and adjacent layers; the removal of the cap layer exposing an upper surface of an uppermost layer of the two uppermost and adjacent layers, the uppermost layer being the layer most remote from the substrate.

11. A method as claimed in claim 10, wherein the oxygen barrier is applied in a manner selected from the group consisting of: around but not over the upper surface, and partially overlapping the upper surface.

12. A method as claimed in claim 8, wherein the oxygen barrier is an oxygen retardant coating and the oxidation is a high oxidation process selected from the group consisting of: gas oxidation, and chemical liquid oxidation.

13. A method as claimed in claim 8, wherein prior to the cap layer being removed, the low resistance cell is detected and identified.

14. A method to convert a low resistance cell in a MRAM device to a capacitive cell, the low resistance cell comprising a plurality of layers on a substrate, at least one layer remote from the substrate being sensitive to oxygen infusion, the method comprising:
   removing a cap layer of the cell;
   applying an oxygen barrier around the cell to expose at least a part of a surface of the at least one layer remote from the substrate; and isolating the low resistance cell by performing at least one selected from the group consisting of:
      at least partially converting the at least one layer to a ceramic state, and
      at least partially oxidizing the at least one layer, thereby converting a low resistance cell in a MRAM device to a capacitive cell.

15. A method as claimed in claim 14 further comprising removing the oxygen barrier; and applying a second cap layer.

16. A method as claimed in claim 14, wherein the conversion is selected from the group consisting of: partially, substantially, and substantially totally; and the conversion makes the at least one layer behave like a capacitor.

17. A method as claimed in claim 14, wherein the at least one layer comprises two uppermost and adjacent layers; the removal of the cap layer exposing an upper surface of an uppermost layer of the two uppermost and adjacent layers, the uppermost layer being the layer most remote from the substrate.

18. A method as claimed in claim 14, wherein the oxygen barrier is applied in a manner selected from the group consisting of: around but not over the upper surface, and partially overlapping the upper surface.

19. A method as claimed in claim 14, wherein the oxygen barrier is an oxygen retardant coating and the oxidation is a high oxidation process selected from the group consisting of: gas oxidation, and chemical liquid oxidation.

20. A method as claimed in claim 14, wherein prior to the cap layer being removed, the low resistance cell is detected and identified.

* * * * *